United States Patent [19]

Kuromitsu et al.

[11] Patent Number: 5,134,029
[45] Date of Patent: Jul. 28, 1992

[54] SUBSTRATE USED FOR FABRICATION OF THICK FILM CIRCUIT

[75] Inventors: Yoshiro Kuromitsu; Hideaki Yoshida; Chuji Tanaka; Hiroto Uchida, all of Saitama; Kenji Morinaga, Fukuoka, all of Japan

[73] Assignee: Mitsubishi Material Corporation, Tokyo, Japan

[21] Appl. No.: 734,130

[22] Filed: Jul. 25, 1991

Related U.S. Application Data

[63] Continuation of Ser. No. 304,460, Feb. 1, 1989, abandoned.

[30] Foreign Application Priority Data

| Feb. 1, 1988 | [JP] | Japan | 63-21579 |
| Feb. 1, 1988 | [JP] | Japan | 63-21580 |
| Feb. 4, 1988 | [JP] | Japan | 63-24628 |

[51] Int. Cl.⁵ .............................. B32B 18/00
[52] U.S. Cl. .................... 428/336; 428/698; 428/699; 428/702
[58] Field of Search ............... 428/329, 446, 469, 698, 428/699, 702, 336; 501/96, 125, 128; 357/71, 80

[56] References Cited

U.S. PATENT DOCUMENTS

| 4,517,584 | 5/1985 | Matsushita et al. | 357/80 |
| 4,659,611 | 4/1987 | Iwase et al. | 428/209 |
| 4,835,039 | 5/1989 | Barringer et al. | 428/210 |
| 4,840,853 | 6/1989 | Ito et al. | 428/698 |

FOREIGN PATENT DOCUMENTS

| 58-11390 | 3/1983 | Japan . |
| 56213209 | 7/1983 | Japan . |
| 62-123087 | 4/1987 | Japan . |
| 62-216979 | 9/1987 | Japan . |

OTHER PUBLICATIONS

Preliminary program of 7th European Hybrid Microelectronics Conference Paper written by Kuromitsu.

Primary Examiner—Geroge F. Lesmes
Assistant Examiner—Christopher Brown
Attorney, Agent, or Firm—Sughrue, Mion, Zinn Macpeak & Seas

[57] ABSTRACT

For improvement in heat radiation capability without sacrifice of affinity for a paste, a substrate used for fabrication of a thick film circuit has a multi-level structure having a foundation of an aluminum nitride and a surface film provided on the foundation, and the surface film is formed of an oxygen compound containing silicon atoms.

3 Claims, 2 Drawing Sheets

SUBSTRATE USED FOR FABRICATION OF THICK FILM CIRCUIT

This is a continuation of application Ser. No. 07/304,460 filed Feb. 1, 1989, now abandoned.

FIELD OF THE INVENTION

This invention relates to a substrate and, more particularly, to a substrate suitable for fabrication of a thick film circuit in a high integration density.

BACKGROUND OF THE INVENTION

A wide variety of an insulating substrate is used for fabrication of a thick film circuit such as, for example, a hybrid integrated circuit, and various materials are available for formation of the insulating substrate. A typical example of such a material is aluminum oxide containing about 4% of miscellaneous substances by weight, and the miscellaneous substances are of silicon oxide, magnesium oxide and calcium oxide. The aluminum oxide substrate is superior in dielectric properties, thermal properties and the mechanical properties to the resin substrate, and, for this reason, the aluminum oxide substrate is shaped into various configuration and widely used by the circuit composers.

However, a problem is encountered in the prior-art substrate of aluminum oxide in heat radiation capability. This is because of the fact that aluminum oxide is not so large in thermal conductivity. Moreover, the thick film circuit is increased in integration density for achieving more complicated circuit behavior. The larger integration density the circuit has, the more heat it generates. Then, the problem becomes more and more serious.

SUMMARY OF THE INVENTION

It is therefore an important object of the present invention to provide a substrate for a thick film circuit which is improved in heat radiation capability.

It is also an important object of the present invention to provide a substrate for a thick film circuit which is suitable for a screen printing process without sacrifice of the heat radiation capability.

To accomplish these objects, the present invention proposes to coat an insulating intermediate film essentially of an aluminum oxide on a foundation of an aluminum nitride with a surface film containing silicon atoms.

In accordance with the present invention, there is provided a substrate used for fabrication of a thick film circuit with a thick film pattern, the thick film pattern including a conductive strip, comprising: a) a foundation of an aluminum nitride having a major surface; and b) a surface film provided on the major surface of the foundation and formed of a silicon oxide, in which the thick film pattern is formed from a paste containing frits, and in which the substrate further comprises an intermediate film containing an aluminum oxide and provided between the foundation and the surface film.

BRIEF DESCRIPTION OF THE DRAWINGS

The features and advantages of a substrate according to the present invention will be more clearly understood from the following description taken in conjunction with the accompanying drawings in which.

DESCRIPTION OF THE PREFERRED EMBODIMENTS

First Embodiment

Figure 1:
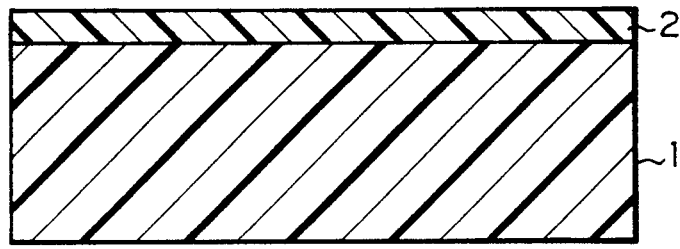
FIG. 1 is a cross sectional view showing the structure of a substrate embodying the present invention.

Referring first to FIG. 1 of the drawings, there is shown the structure of a substrate embodying the present invention, and the substrate is formed in a multilevel structure. The substrate illustrated in FIG. 1 comprises a foundation 1 of aluminum nitride represented by the molecular formula of AlN, and a surface film 2 of a silicon oxide represented by the molecular formula of $SiO_2$.

The aluminum oxide represented by the molecular formula $Al_2O_3$ has a heat conductivity of about 0.052 cal/sec. cm deg., and the heat conductivity of the aluminum nitride is as large as about 0.620 cal/sec. cm deg. Then, the substrate according to the present invention is improved in heat radiation capability with respect to the prior-art substrate using the aluminum oxide. However, the aluminum nitride is liable to produce foamable gases as a result of reactions with some substances contained in a paste used in screen printing techniques, and, for this reason, a substrate formed of the aluminum nitride only is hardly used in the formation of a thick film circuit. In detail, most of the paste contains frits such as, for example, lead oxide or bismuth oxide, and these frits react with aluminum nitride. As a result, foamable gases tend to be produced and cause the interface between the aluminum nitride and the sintered product to have hollow spaces after the evacuation of the foamable gases. The foamable gases are operative to decrease the contact area therebetween, so that the thick film pattern produced by sintering the printed film is liable to peel from the aluminum nitride substrate. For improvement in peeling strength, the substrate according to the present invention is provided with the surface film 2 of the silicon oxide covering the foundation 1. The surface film 2 is deposited to a thickness ranging between about 0.1 micron and about 20 microns by using a physical deposition technique or a chemical deposition technique. A sputtering technique is, by way of example, employed for the deposition of the surface film, however, a sol-gel method or a photo assisted chemical vapor deposition technique may be alternatively used. The silicon oxide reacts with the frits without formation of any foamable gases and, accordingly, provides silicon atoms into the paste. These silicon atoms are conducive to improvement in bonding strength between the aluminum nitride and the paste. One of the reasons why the bonding strength is improved is considered to be the enhanced viscosity of the frits.

Description is hereinunder made for various formation processes of the substrate according to the present invention.

The first formation process starts with preparation of an aluminum nitride powder the particles of which are about 1 micron in average diameter. The aluminum nitride powder is mixed into an organic binder to produce a paste, and the paste is shaped into a green sheet. The green sheet is placed into a nitrogen ambient of the atmospheric pressure. The green sheet is heated to about 1800 degrees in centigrade and kept in the high temperature nitrogen ambient for about 120 minutes for sintering. A ceramic sheet thus produced by the sintering measures about 25.4 millimeters×about 25.4 millimeters and is about 2 millimeters in thickness and serves as the foundation 1 of the substrate. The ceramic sheet is then placed in an RF diode sputtering system using a target of quartz having a purity of about 99.9%. The target is about 100 millimeters in diameter and about 10 millimeters in thickness. The ceramic sheet is driven for rotation at about 10 r.p.m. and the sputtering is carried out at about 100 watts. Some samples are thus produced by using the sputtering technique, and the surface films 2 of the samples are varied in thickness by appropriately selecting the sputtering time period. One of the ceramic sheet is not coated with the surface film for comparison use.

The heat conductivity and a peeling strength are measured for each sample as shown in Table 1. The heat conductivity is measured by using a laser flushing method. The peeling strength is measured for an evaluation of the bonding strength. For the measurement of the peeling strength, a conductive paste of a silver-palladium alloy is screen printed on each of the samples including the ceramic sheet without the surface film, and the printed paste line contains frits such as, for example, a lead oxide (PbO) and a bismuth oxide ($Bi_2O_3$).

After a drying stage, the sample with the printed paste line is placed in a high temperature ambient of about 850 degrees in centigrade for about 10 minutes for sintering, then a conductive strip 3 is produced on the sample. The conductive strip 3 is square of about 2 millimeters×about 2 millimeters. A non-oxidized copper wire 4 is prepared and soldered to the conductive strip 3 at about 215 degrees in centigrade The copper wire 4 is about 0.9 millimeter in diameter, and an eutectic alloy 5 of tin and lead is used for the soldering. The copper wire 4 thus soldered is pulled in a direction indicated by an arrow T. The pulling force is increased until the conductive strip 3 begins to peel, and the peeling strength is calculated as dividing the maximum pulling force by a unit area of 4 square millimeters.

The second formation process is similar in the formation of the ceramic sheet to the first formation process, however, the surface film is deposited by using the sol-gel technique. Namely, after the formation of the ceramic sheet, about 347 grams of ethyl silicate, about 500 grams of ethyl alcohol and about 190.2 grams of 0.3% hydrochlorid acid are mixed for producing a solution, and the solution is spun onto the ceramic sheet at about 500 r.p.m. The ceramic sheet with the wetted surface is placed in a high temperature ambient of about 900 degrees in centigrade for about 10 minutes so as to calcine the solution. Thus, a thin film of silicon dioxide is formed on the ceramic sheet, the spin coating and the calcining are repeated certain times for adjusting the thickness of the surface film 2. Some samples are thus formed and are different in the thickness of the surface film from one another. The heat conductivity and the peeling strength are also measured for these samples as shown in Table 1.

The third formation process is characterized by the photo assisted chemical vapor deposition technique. After the formation of the ceramic sheet in the similar manner to the first formation process, the ceramic sheet is placed in a reactor. A low pressure ambient of about 0.2 torr is created in the reactor, and a mercury lamp is used for a photo radiation. The ceramic sheet is heated to about 150 degrees in centigrade, and a gaseous mixture of silane and oxygen is supplied to the reactor for the deposition of silicon dioxide. In this instance, the proportion of silane to oxygen is about 0.015 by mole. Some samples are formed in accordance with the third process and are different in the thickness of the surface film by controlling the reacting time period. The heat conductivity and the peeling strength are also measured for these samples as shown in Table 1.

For comparison use, the prior-art substrate of the aluminum oxide is formed by the following process. First, an aluminum oxide powder is prepared. The aluminum oxide is about 96% in purity and about 2 microns in average diameter. The aluminum oxide powder is mixed with an organic binder to produce a paste. The paste is shaped into a sheet and, then, placed in an atmospheric ambient at about 1600 degrees in centigrade for about 120 minutes for sintering. The prior-art sample is similar in geometry to the samples formed by the above mentioned processes.

TABLE 1

| Sample | Surface film Process | Thickness ($\mu m$) | Heat Conductivity (cal/ sec.cm.deg.) | Peeling Strength (kg/4 mm$^2$) |
| --- | --- | --- | --- | --- |
| 1 | Photo CVD | 0.01 | 0.617 | 1.9 |
| 2 | Photo CVD | 0.1 | 0.612 | 4.0 |
| 3 | Sol/gel | 0.2 | 0.607 | 4.3 |
| 4 | Sputtering | 1.1 | 0.564 | 4.2 |
| 5 | Sol/gel | 2.0 | 0.528 | 4.6 |
| 6 | Sol/gel | 10.2 | 0.333 | 4.5 |
| 7 | Sputtering | 4.1 | 0.463 | 4.1 |
| 8 | Sol/gel | 7.0 | 0.389 | 4.4 |
| 9 | Sol/gel | 19.8 | 0.234 | 4.3 |
| 10 | Sol/gel | 20.0 | 0.229 | 3.8 |
| 11 | Sol/gel | 85.0 | 0.076 | 2.5 |
| Ceramic sheet | AlN | | 0.617 | 0 |
| Prior-art sample | $Al_2O_3$ | | 0.052 | 4.5 |

As will be understood from Table 1, the substrate according to the present invention is advantageous over the prior-art substrate in heat conductivity without sacrifice of the peeling strength. If the surface face film 2 is less than about 0.1 micron, the thick film is not reliable due to the small peeling strength. This reduction in peeling strength is causative of projections of melted frits into the aluminum nitride and the foamable gases are produced at the interface between the aluminum nitride and the conductive line. On the other hand, if the surface film 2 is deposited to a thickness larger in value than about 20 microns, the heat conductivity is too small to fabricate a thick film circuit at a high integration density. This is because of the fact that the silicon oxide has the heat conductivity of about 0.0037.

Second Embodiment

The second embodiment of the substrate according to the present invention has the two-level structure as similar to the substrate shown in FIG. 1, i.e., a foundation coated with a surface film. The foundation is also formed of the aluminum nitride, however, the surface film is formed of an oxygen compound containing aluminum atoms and silicon atoms. A typical example of such an oxygen compound is represented by the molecular formula of $3Al_2O_3 2SiO_2$.

Description is made for various formation processes of the substrate.

The first formation process starts with preparation of an aluminum nitride powder the particles of which are about 1 microns in average diameter. The aluminum nitride powder is mixed with an organic binder to produce a paste, and the paste is shaped into a green sheet. The green sheet is placed in a nitrogen ambient of the atmospheric pressure. The green sheet is heated to about 1800 degrees in centigrade and kept in the high temperature nitrogen ambient for about 120 minutes for sintering. A ceramic sheet thus produced by the sintering is square shape of about 25.4 millimeters × about 25.4 millimeters and about 3 millimeters in thickness. The ceramic sheet is then placed in an RF diode sputtering system using a target the substance of which is represented by the formula of $3Al_2O_3 - 2SiO_2$. The target is about 100 millimeters in diameter and about 10 millimeters in thickness. The ceramic sheet is driven for rotation at about 10 r.p.m. and the sputtering is carried out at about 100 watts. Some samples are thus produced by using the sputtering technique, and the surface films of the samples are varied in thickness by appropriately selecting the sputtering time period. One of the ceramic sheet is not coated with the surface film for comparison use. The heat conductivity and a peeling strength are measured for each sample as shown in Table 2.

The second formation process is similar in the formation of the ceramic sheet to the first formation process, however, the surface film is deposited by using the sol-gel technique. Namely, after the formation of the ceramic sheet, about 347 grams of ethyl silicate, about 560 grams of aluminum ethyl acetaacetate diisopropyleto, about 500 grams of ethyl alcohol and about 190 grams of 0.3% hydrochlorid acid are mixed for producing a solution, and the solution is spun onto the ceramic disk at about 500 r.p.m. The ceramic sheet with the wetted surface is placed in a high temperature ambient of about 850 degrees in centigrade for about 10 minutes for a calcining. Thus, a thin film of the oxygen compound is formed on the ceramic sheet, the spin coating and the calcining are repeated certain times for adjusting the thickness of the surface film. Some samples are thus formed and are different in the thickness of the surface film from one another. The heat conductivity and the peeling strength are also measured for these samples as shown in Table 2.

TABLE 2

| Sample | Surface film Process | Thickness ($\mu$m) | Heat Conductivity (cal/sec.cm.deg.) | Peeling Strength (kg/4 mm$^2$) |
|---|---|---|---|---|
| 1 | Sputtering | 0.02 | 0.617 | 2.8 |
| 2 | Sputtering | 0.1 | 0.614 | 4.2 |
| 3 | Sputtering | 0.3 | 0.606 | 4.2 |
| 4 | Sol/gel | 0.9 | 0.594 | 4.5 |
| 5 | Sol/gel | 1.7 | 0.588 | 4.6 |
| 6 | Sol/gel | 5.0 | 0.528 | 4.6 |
| 7 | Sol/gel | 10.6 | 0.460 | 4.2 |
| 8 | Sol/gel | 19.7 | 0.320 | 4.1 |
| 9 | Sol/gel | 20.0 | 0.318 | 3.2 |
| 10 | Sol/gel | 75.0 | 0.151 | 2.4 |
| Ceramic disk | AlN | | 0.617 | 0 |
| Prior-art sample | Al$_2$O$_3$ | | 0.052 | 4.5 |

As will be understood from Table 2, the substrate according to the present invention is advantageous over the prior-art substrate in heat conductivity without sacrifice of the peeling strength. In these samples, the substrate with the surface film less than about 0.1 micron is too small to rely thereupon. On the other hand, if the surface film is larger in thickness than about 20 microns, the heat conductivity is not improved to fabricate a thick film circuit at a high integration density. The substrate of the second embodiment is further improved in heat conductivity, because the surface film is formed of the oxygen compound containing the silicon oxide less than that of the first embodiment.

Third Embodiment

Figure 3:
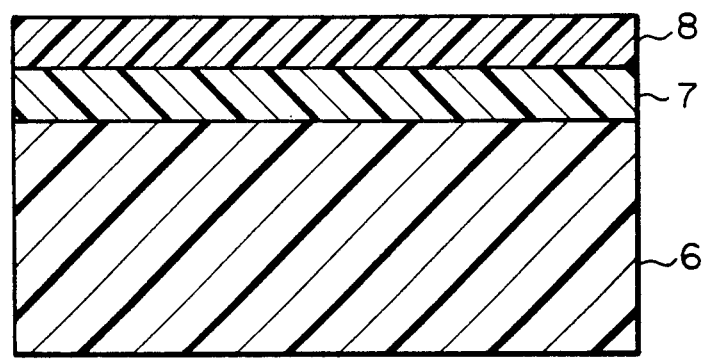
FIG. 3 is a cross sectional view showing the structure of another substrate embodying the present invention.
Figure 2:
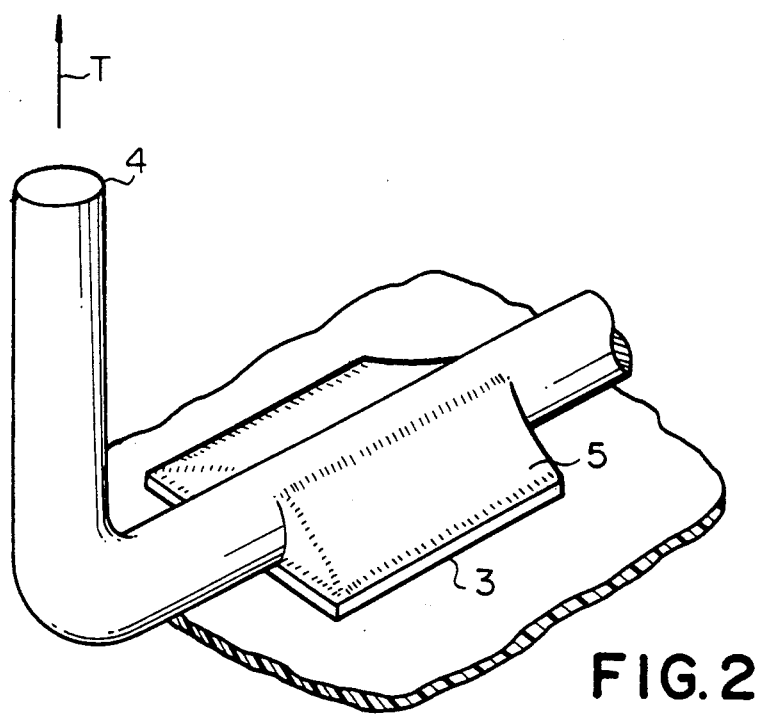
FIG. 2 is a perspective view showing a method of measuring a peeling strength.

Turning to FIG. 3 of the drawings, the three level structure of a substrate is illustrated. The three-level structure is formed by a foundation 6 of the aluminum nitride, an intermediate film 7 of an aluminum oxide represented by the molecular formula of $Al_2O_3$ and a surface film 8 of a silicon oxide represented by the molecular formula of $SiO_2$. The intermediate film 7 aims at preventing the foundation from reactions with frits contained in a paste used in the screen printing techniques. This is because of the fact that aluminum oxide is less reactive with the frits such as, for example, lead oxide and bismuth oxide than the aluminum nitride.

The intermediate film 7 has a thickness ranging between about 0.09 micron and about 19.3 microns, and the thickness of the surface film 8 ranges from about 0.01 micron to about 3.5 microns. If the intermediate film 7 is less than about 0.09 micron, the projections of the melted frits are hardly interrupted. On the other hand, if the intermediate film is equal to or greater than about 0.09 micron under the sintering at about 850 degrees in centigrade for about 10 minutes, the frits in the presence of the silicon atoms remain in a paste used for formation of a thick film pattern, thereby being capable of enhancing the bonding strength. The heat conductivity of the substrate is still further improved without sacrifice of the peeling strength in comparison with the first embodiment in so far as the total thickness of the intermediate film 7 and the surface film 8 remains under about 20 microns.

The intermediate film 7 is formed by using a sputtering technique, an oxidation technique carried out in the presence of oxygen, and a chemical vapor deposition technique. However, the oxidation technique is desirable for the formation of the intermediate film of the aluminum oxide. The oxidation is by way of example carried out at about 1100 degrees to about 1500 degrees in centigrade in the presence of oxygen ranging from about 1 atm to about $10^{-2}$ atm. On the other hand, the silicon oxide is deposited by using a physical deposition technique such as, for example, a sputtering technique, a sol-gel technique or a chemical vapor deposition technique.

The formation process is hereinunder described in detail. The process starts with preparation of an aluminum nitride powder the particles of which are about 1 microns in average diameter. The aluminum nitride powder is mixed with an organic binder to produce a paste. The paste is shaped into a green sheet and placed in a nitrogen ambient of the atmospheric pressure at about 1800 degrees in centigrade for about 120 minutes so as to sinter the green sheet. Thus, a plurality of ceramic sheets are produced through the sintering stage, and each of the ceramic sheets is square in shape measuring as about 25.4 millimeters × about 25.4 millimeters, the thickness thereof is about 2 millimeters. The ceramic sheets serve as the foundations.

Subsequently, the intermediate films are formed on the ceramic sheets, respectively. The sputtering technique, the oxidation technique and the chemical vapor deposition technique are applied thereto. Namely, the ceramic sheet is placed in an RF diode sputtering system accompanied with a target of the aluminum oxide ($Al_2O_3$) with a purity of about 99.5%. The target is about 100 millimeters in diameters and about 10 millimeters in thickness. The ceramic sheet is driven for rotation at about 10 r.p.m., and the sputtering is carried out at about 100 watts. The intermediate films 7 are deposited on some ceramic sheets, and the thicknesses thereof are different from one another by changing the sputtering time period. In the oxidation technique, an oxidation ambient is created in the presence of oxygen of about $10^{-1}$ atm, and the ceramic sheet is heated to about 1300 degrees in centigrade. The surface of the ceramic sheet is oxidized to form the aluminum oxide, and the thickness of the aluminum oxide film is adjusted by controlling the reacting time period. Some intermediate films 7 are thus formed on the ceramic sheet, respectively. When the intermediate film 7 is formed by using the chemical vapor deposition technique, the ceramic sheet is placed in a reactor chamber, and a gaseous mixture is supplied to the reactor chamber. The gaseous mixture contains hydrogen, aluminum chloride and carbon dioxide, and the flow rates are about 5 liters per minute for hydrogen, about 100 cubic centimeters per minute for aluminum chloride and about 150 cubic centimeters per minute for carbon dioxide. The chemical vapor deposition is carried out at about 1020 degrees in centigrade in about 40 torr, and the reaction time period is varied for formation of the intermediate films 7 with different thicknesses.

Finally, the surface film 8 is deposited on each of the intermediate films 7, and a sputtering technique, a sol-gel technique and a photo assisted chemical vapor deposition technique are applied to the resultant structures of the previous stage. For the sputtering technique, a quartz target with the purity of about 99.9% is set in the RF diode sputtering system, however, the other sputtering conditions are similar to those of the deposition of the aluminum oxide. The sol-gel technique starts with preparation of a solution by mixing about 347 grams of ethyl silicate, about 500 grams of ethyl alcohol and about 190.2 grams of 0.3% hydrochlorid acid. The solution is spun onto the ceramic sheet at about 500 r.p.m. The ceramic sheet with the wetted surface is placed in a high temperature ambient of about 900 degrees in centigrade for about 10 minutes for the calcining. Thus, a thin film of the silicon oxide is formed on the ceramic sheet, the spin coating and the calcining are repeated certain times for adjusting the thickness of the surface film 8. Some samples are thus formed and are different in the thickness of the surface film from one another. On the other hand, when the silicon oxide is deposited by using the photo assisted chemical vapor deposition technique, the ceramic sheet is placed in a reactor. A low pressure ambient of about 0.2 torr is created in the reactor, and a mercury lamp is used for a photo radiation. The ceramic sheet is heated to about 150 degrees in centigrade, and a gaseous mixture of silane and oxygen is supplied to the reactor for the deposition of silicon dioxide. In this instance, the proportion of silane to oxygen is about 0.015 by mole. The silicon oxide films are different in the thickness by controlling the reacting time period. Table 3 shows the samples formed by using the above processes.

For comparison use, the prior-art substrate of the aluminum oxide is formed by the following process. First, an aluminum oxide powder is prepared. The aluminum oxide is about 96% in purity and about 2 microns in average diameter. The aluminum oxide powder is mixed with an organic binder to produce a paste. The paste is shaped into a green sheet and, then, placed in an atmospheric ambient at about 1600 degrees in centigrade for about 120 minutes for sintering. The prior-art sample is similar in geometry to the samples formed by the above mentioned processes.

The heat conductivity and the peeling strength are measured for both of the those samples and the prior-art substrate as shown in Table 4.

TABLE 3

| | Intermediate film | | Surface film | |
|---|---|---|---|---|
| Sample | Process | Thickness (μm) | Process | Thickness |
| 1 | Sputtering | 0.01 | Photo CVD | 0.01 |
| 2 | Sputtering | 0.09 | Photo CVD | 0.01 |
| 3 | Sputtering | 2.4 | Sol/gel | 0.2 |
| 4 | CVD | 2.6 | Sol/gel | 0.3 |
| 5 | Oxidation | 4.1 | Sputtering | 0.5 |
| 6 | Oxidation | 6.2 | Sol/gel | 0.7 |
| 7 | Oxidation | 9.9 | Sol/gel | 0.3 |
| 8 | CVD | 15.0 | Photo CVD | 1.0 |
| 9 | Oxidation | 19.3 | Sputtering | 0.7 |
| 10 | Oxidation | 15.1 | Sol/gel | 1.5 |
| 11 | Oxidation | 20.0 | Sputtering | 5.0 |
| 12 | Oxidation | 45.0 | Sol/gel | 35.0 |
| Prior-art sample | $Al_2O_3$ | | | 0.052 |

TABLE 4

| Sample | Heat Conductivity (cal/sec.cm.deg.) | Peeling Strength (kg/4 $mm^2$) |
|---|---|---|
| 1 | 0.616 | 2.8 |
| 2 | 0.616 | 4.0 |
| 3 | 0.603 | 4.1 |
| 4 | 0.598 | 4.3 |
| 5 | 0.589 | 4.3 |
| 6 | 0.577 | 4.5 |
| 7 | 0.586 | 4.4 |
| 8 | 0.546 | 4.2 |
| 9 | 0.557 | 4.2 |
| 10 | 0.462 | 4.1 |
| 11 | 0.417 | 3.5 |
| 12 | 0.154 | 2.9 |
| Prior-art sample | 0.052 | 4.5 |

As will be understood from Table 4, the peeling strength is maintained even if the surface film is decreased to a thickness less than about 0.1 micron. This advantage is resulted from the intermediate film which is operative to restrict the projections of the melted frits. The substrate of the third embodiment is still further improved in heat conductivity, since the silicon oxide with the small heat conductivity is reduced in thickness.

When the surface film or the multi-film structure of the intermediate film and the surface film is increased in thickness, the projections of the melted frits are perfectly restricted even if the heat application is repeated during the formation process of the thick film circuit.

Although particular embodiments of the present invention have been shown and described, it will be obvious to those skilled in the art that various changes and modifications may be made without departing from the spirit and scope of the present invention.

What is claimed is:

1. A substrate on which a thick film circuit with a thick film pattern is formed after completion of said substrate, said thick film pattern including a conductive strip containing a frit selected from the group consisting of lead oxide and bismuth oxide, the substrate comprising:

a) a foundation having a major surface and consisting essentially of a substance represented by the molecular formula of AlN;

b) an intermediate film consisting essentially of a substance represented by the molecular formula of $Al_2O_3$ and produced through an oxidation of said foundation, said intermediate film being formed on the major surface of said foundation and having a thickness ranging from about 0.09 micron to about 19.3 microns; and c) a surface film consisting essentially of silicon dioxide, said surface film being formed on said intermediate film and having a thickness ranging from about 0.01 micron to about 5.0 microns, said surface film being formed through one of a chemical vapor deposition, a physical vapor deposition and a sol-gel technique, said thick film circuit being fabricated on said surface film, said surface film enhancing adhesion between said substrate and said thick film circuit in the presence of said intermediate film.

2. A substrate used for fabrication of a thick film circuit as set forth in claim 1, in which said intermediate film is formed of a compound smaller in reactivity with said frits than said aluminum nitride.

3. A substrate comprising:

a) a foundation of aluminum nitride having a major surface;

b) an intermediate film formed of aluminum oxide and provided on the major surface of said foundation, said intermediate film ranging from about 0.09 micron to about 19.3 microns in thickness; and c) a surface film provided on said intermediate film and consisting essentially of silicon dioxide, said surface film ranging from about 0.01 micron to about 5.0 microns in thickness, said surface film being formed through one of a chemical vapor deposition, a physical vapor deposition and a sol-gel technique.

* * * * *